United States Patent
An et al.

(10) Patent No.: US 6,464,930 B2
(45) Date of Patent: Oct. 15, 2002

(54) FURNACE OF APPARATUS FOR MANUFACTURING A SEMICONDUCTOR DEVICE HAVING A HEAT BLOCKER FOR PREVENTING HEAT LOSS DURING THE UNLOADING OF WAFERS

(75) Inventors: Jae-Hyuck An; Chang-Zip Yang; Tae-Chul Kim; Hyun Han, all of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 20 days.

(21) Appl. No.: 09/726,327

(22) Filed: Dec. 1, 2000

(65) Prior Publication Data

US 2001/0004140 A1 Jun. 21, 2001

(30) Foreign Application Priority Data

Dec. 1, 1999 (KR) ............................................. 99-54172

(51) Int. Cl.[7] ................................................. C21D 1/06
(52) U.S. Cl. ....................................... 266/252; 432/214
(58) Field of Search ................................ 432/241, 214; 266/252, 249

(56) References Cited

U.S. PATENT DOCUMENTS

| | | | |
|---|---|---|---|
| 5,370,371 A | | 12/1994 | Miyagi et al. |
| 5,480,300 A | * | 1/1996 | Okoshi et al. ............... 432/241 |
| 5,947,718 A | * | 9/1999 | Weaver ....................... 432/241 |
| 6,005,225 A | * | 12/1999 | Kowalski et al. ........... 219/390 |

FOREIGN PATENT DOCUMENTS

GB          2298314 A   *   8/1996

* cited by examiner

Primary Examiner—Scott Kastler
(74) Attorney, Agent, or Firm—Volentine Francos, PLLC

(57) ABSTRACT

The present invention relates to a semiconductor manufacturing furnace having a heat blocker mounted to an elevating plate of the furnace. The heat blocker prevents the internal temperature of the furnace from decreasing radically when a wafer boat is lowered from the processing chamber of the furnace by the elevating plate. The heat blocker includes a sealed case, a plurality of horizontally extending heat-reflecting plates disposed in the case, and a plurality of support pins for supporting and fixing the reflecting plates in place. The heat-reflecting plates reflect heat back up into the processing chamber, as the elevating plate lowers the wafer boat, to keep the internal temperature of the heater stable. This not only enhances the productivity of the manufacturing process but also enhances the uniformity of the processed wafers.

4 Claims, 3 Drawing Sheets

FURNACE OF APPARATUS FOR MANUFACTURING A SEMICONDUCTOR DEVICE HAVING A HEAT BLOCKER FOR PREVENTING HEAT LOSS DURING THE UNLOADING OF WAFERS

BACKGROUND OF THE INVENTION

1. Field of the Invention

The present invention relates to apparatus for manufacturing a semiconductor device. More particularly, the present invention relates to the furnace of an apparatus for processing a wafer in the manufacturing of a semiconductor device.

2. Brief Description of the Related Art

In general, semiconductor device manufacturing processes include a chemical vapor deposition (CVD) process in which a chemical compound in a vapor state is deposited on the surface of a wafer to form a layer on the wafer. The layer serves as a dielectric or a conductor in the final semiconductor device. The CVD process is carried out in a reaction chamber and is usually classified according to the pressure at which it is carried out in the chamber, i.e., as low pressure CVD or high pressure CVD. The low pressure CVD process is carried out at a pressure of 0.1~100 Torr.

In addition to pressure, a number of operational conditions prevailing in the reaction chamber (referred to as a furnace hereinafter), such as temperature, the wafer gap and gas flow, affect the uniformity of the layer formed on the surface of the wafer by CVD. Among these conditions, the temperature in the furnace, particularly at the bottom part thereof, must be kept constant if a uniform layer is to be formed on the semiconductor wafer. However, it is difficult to maintain a constant temperature in the furnace, particularly at the bottom thereof.

In addition, just prior to the CVD process, a door of the furnace is opened to admit a wafer boat, loaded with semiconductor wafers, into the chamber. Thereafter, it takes a predetermined number of hours to increase the internal temperature of the furnace to one that is suitable for the CVD process because opening the furnace door releases heat from the furnace. Moreover, the heat produced to re-heat the furnace is not uniformly distributed therein. Therefore, problems occur such as poor uniformity in the layer formed by CVD and instability in the operational processes.

In order to solve the aforementioned problems, a plurality of quartz boards of the same size as the wafer have been installed under the wafer boat to reduce thermal loss at the bottom of the furnace. However, the installation of these boards has proven disadvantageous in terms requiring significant operational time and compromising productivity.

In order to solve the conventional problems described above, Japanese Patent No. Heisei 01-130523 proposes a bell-shaped heat treatment furnace provided with a reflector at the bottom thereof.

As shown in FIG. 1, the furnace comprises a heat insulation member 10, a heater core tube 11 disposed within the heat insulation member 10, a heat-distributing sleeve 12, and a heater 13.

In addition, an air supply tube 11a extends along a lateral wall of the heater core tube 11 to the top of the heater core tube 11 for supplying reactant gas into the furnace at the top thereof. A plurality of wafers W are supported in a wafer boat 17 so as to receive the reactant gas. The wafer boat 17 is positioned on a heater cover 14 disposed under the heater core tube 11. A plurality of heat-reflecting plates 16 are interposed between the wafer boat 17 and the heater cover 14. Both the wafer boat 17 and the reflecting plates 16 are mounted to a rotational shaft 15.

Furthermore, an exhaust pipe 14a is connected to the lateral wall of the heater cover 14. Cooling pipes 18a, 18b are located along the bottom and the top of the heater core tube 11 and the heater cover 14, respectively. A seal 19 is interposed between the cooling pipes 18a, 18b.

The heater cover 14 is raised to insert the wafer boat 17, loaded with wafers W, and the reflecting plates 16 into the heater core tube 11, whereupon a gap between the cooling pipes 18a, 18b is eliminated by the seal 19. Then, the wafers W are heated to a predetermined temperature by heater 13, and a reactant gas is supplied into the furnace via the air supply tube 11a. At this time, the seal 19 is kept cool by cool water that circulates through the cooling pipes 18a, 18b.

However, even though the reflecting plates 16 are advantageous in that they do not require a great deal of space and yet enhance the mass production capability of the furnace, they are disadvantageous in terms of their structural stability. Specifically, the reflecting plates vibrate significantly during operation and do not satisfactorily prevent thermal loss.

SUMMARY OF THE INVENTION

An object of the present invention is to solve the aforementioned problems of the prior art. More specifically, an object of the present invention is to provide apparatus for manufacturing a semiconductor device, which apparatus has an improved structural stability and an improved ability to prevent heat loss.

In order to accomplish the aforementioned object, the present invention provides a semiconductor manufacturing furnace having a heat blocker that includes a sealed case, a plurality of horizontally extending heat-reflecting plates disposed in the case, and a plurality of support pins for supporting and fixing the heat-reflecting plates in position to keep them from vibrating.

The heat blocker is provided between a wafer boat and an elevating plate of the furnace so as to minimize the thermal loss in the furnace that would otherwise occur during the loading of the wafer boat. The heat-reflecting plates reflect heat upwardly into the processing chamber of the furnace as the wafer boat is elevated by the elevating plate. Therefore, the internal temperature of the furnace is stabilized quickly and only a small amount of time is required to heat the furnace to the desired processing temperature after the wafer boat is loaded with the wafers to be processed, whereby the productivity of the manufacturing process and the uniformity of the processed wafers are enhanced.

DETAILED DESCRIPTION OF THE PREFERRED EMBODIMENT

Now, a preferred embodiment of the present invention will be described in detail with reference to the accompanying drawings.

Figure 1:
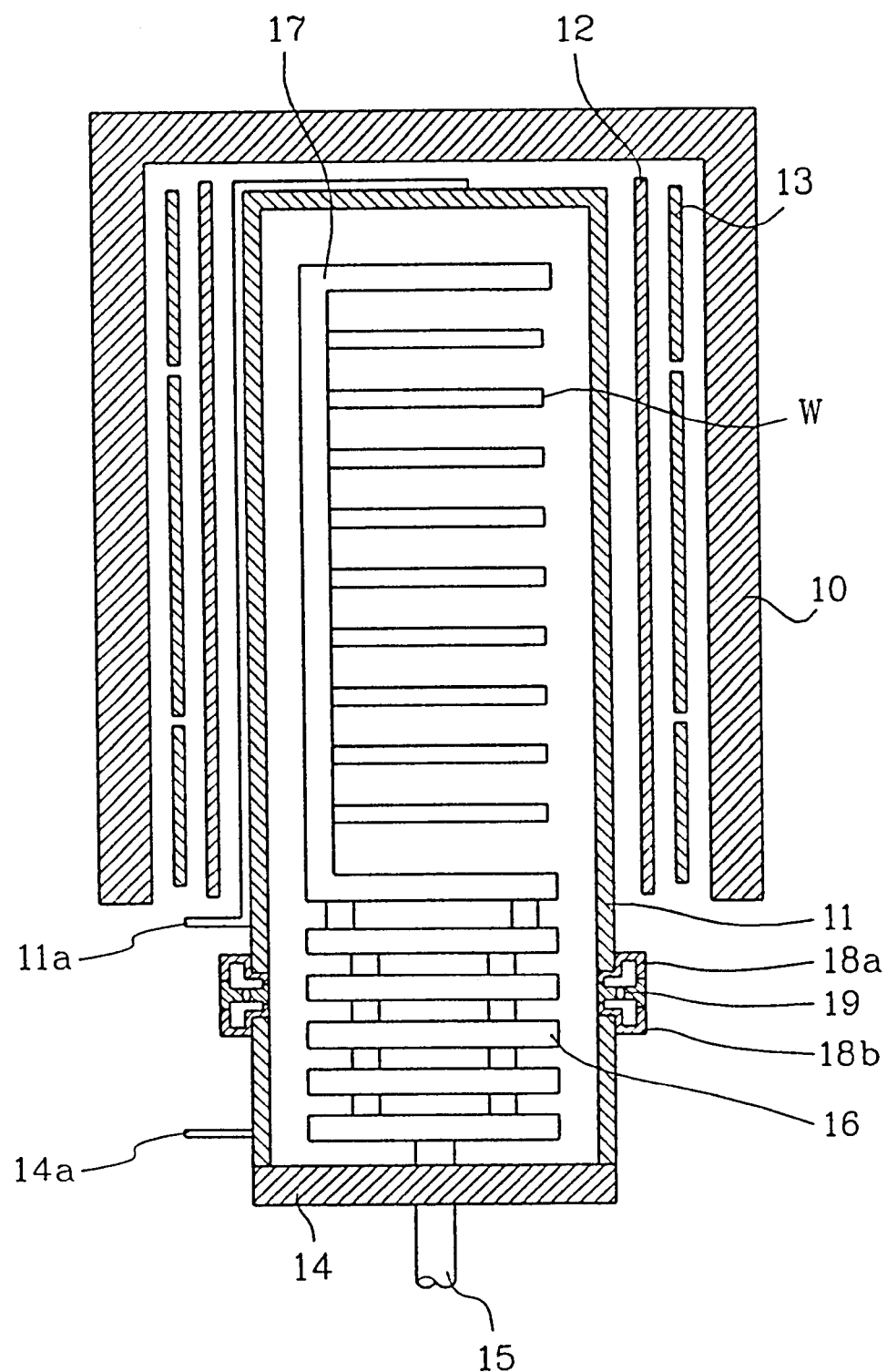
FIG. 1 is a vertical sectional view of a conventional semiconductor manufacturing apparatus.
Figure 2:
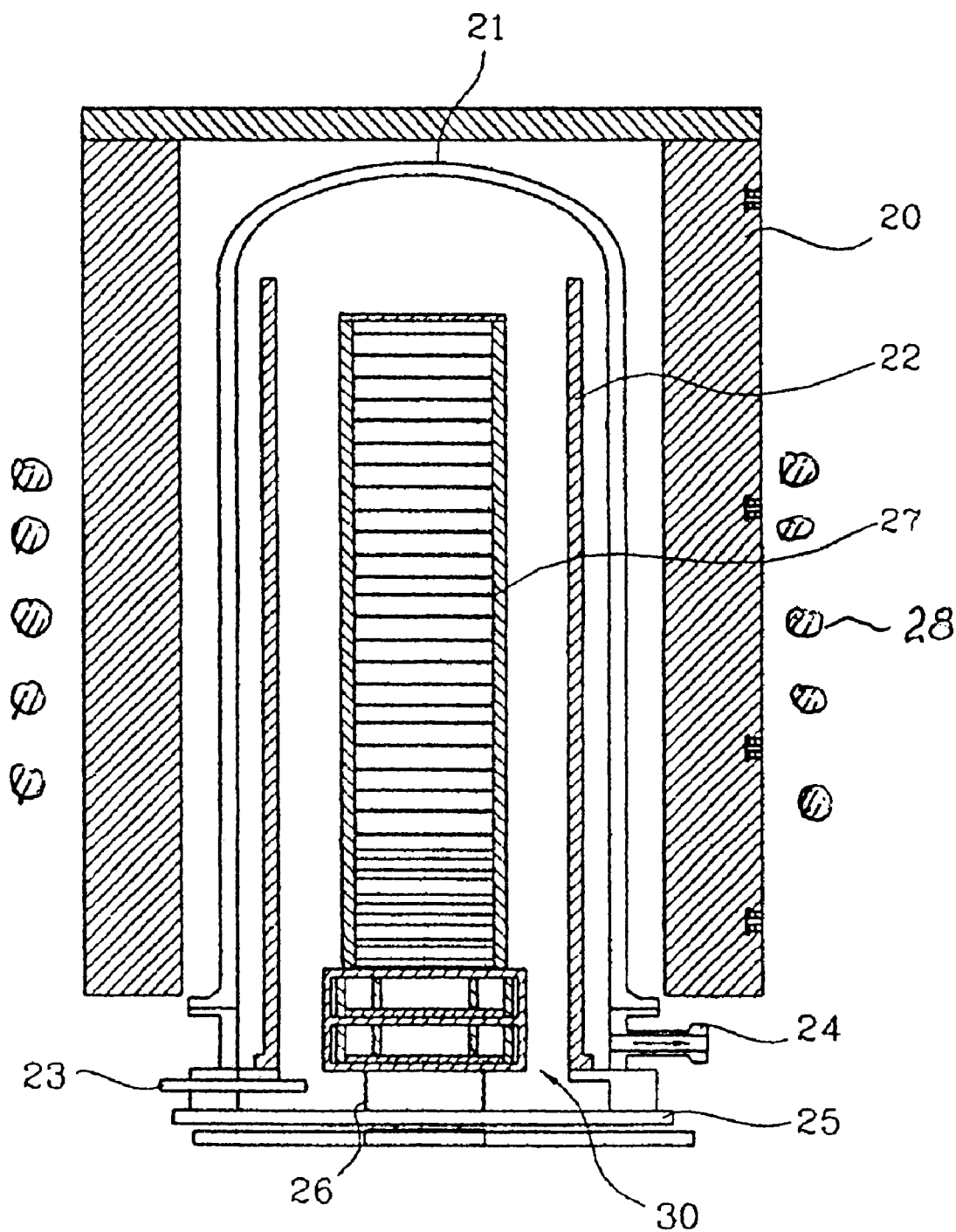
FIG. 2 is a vertical sectional view of a semiconductor manufacturing apparatus according to the present invention.

As shown in FIG. 2, the semiconductor device manufacturing apparatus of the present invention includes a furnace chamber having an open bottom. The furnace chamber comprises a thermal insulating member 20, a bell-shaped external member 21 disposed in the insulating member 20, and an internal chamber-forming pipe 22 disposed in the external member 21 as spaced therefrom. A reaction or processing space is defined by and within the chamber-forming pipe 22, and an exhaust space is defined between the internal chamber-forming pipe 22 and the bell-shaped external member 21. A heater 28 is disposed outside of the insulating member 20 and is operative to heat the interior of the furnace chamber to a desired processing temperature.

A gas supply tube 23 opens to the reaction chamber at a location under the pipe 22 for supplying reactant gas into the reaction chamber. On the other hand, an exhaust opening 24 opens to the exhaust space at a location across from the open end of the gas supply tube 23, for exhausting the gas from the furnace chamber.

In addition, an elevating plate 25 is disposed beneath the open bottom of the furnace chamber and is movable up and down by driving means (not shown) which is conventional per se. A rotational shaft 26 projects upwardly from the elevating plate 25 and is rotatable by rotary driving means (also not shown).

A wafer boat 27 is mounted to the elevating plate 25 via the rotational shaft 26 and a heat blocker 30. More particularly, the heat blocker 30 is interposed between the rotational shaft 26 and the wafer boat 27 for preventing heat in the reaction space from moving downwards from the furnace.

Figure 3:
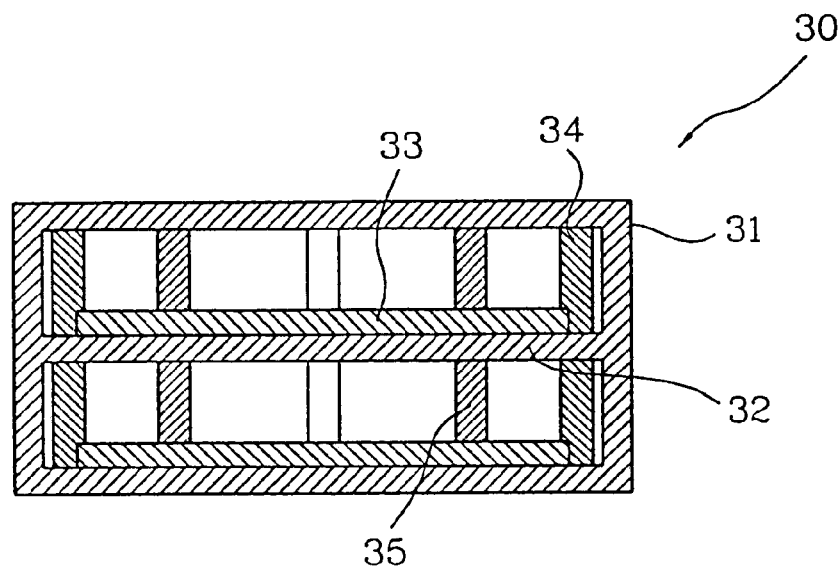
FIG. 3 is a vertical sectional view of a heat blocker of semiconductor manufacturing apparatus according to the present invention.
Figure 4:
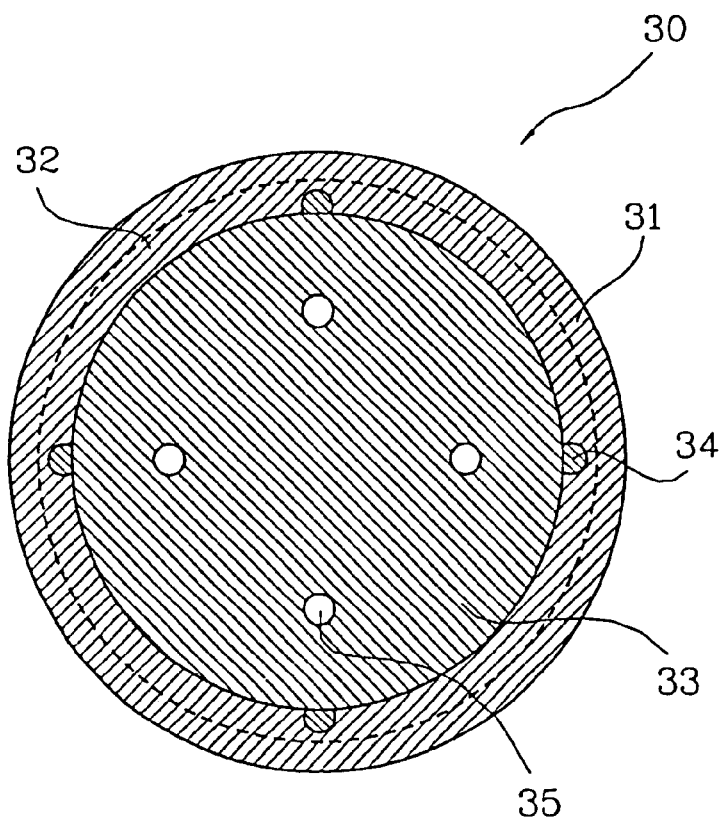
FIG. 4 is a cross-sectional view of the heat blocker.

The heat blocker 30, as also shown in FIGS. 3 and 4, comprises a sealed case including an outer casing 31, and a diaphragm 32 extending horizontally across the interior of the casing 31 so as to divide the interior into a plurality of discrete spaces. The heat blocker 30 also includes a plurality of heat-reflecting reflecting plates 33. One of the heat-reflecting plates 33 rests on the bottom of the casing 31, and another of the heat-reflecting plates 33 rests on the diaphragm 32.

Still further, the heat blocker 30 also includes a plurality of vertically extending support pins that hold the heat-reflecting plates 33 in place at positions selected to prevent the heat-reflecting plates 33 from vibrating during the operation of the apparatus. These support pins include a plurality of external support pins 34 abutting the outer edges of the heat-reflecting plates 33, and a plurality of internal support pins 35 disposed against major surfaces (in this case the upper surfaces ) of the heat-reflecting plates 33.

The external support pins 34 can be notched to receive the outer edges of the heat-reflecting plates 33. In this case, the external support pins 34 prevent the heat-reflecting plates 33 from vibrating in both the vertical and horizontal directions.

The interior of the casing 31 is preferably in a vacuum state. In addition, the to heat-reflecting plates 33 are of a material having melting point greater than the temperature produced in the furnace during operation. Preferably, the heat-reflecting plates 33 are of a metal that reflects heat with a high degree of efficiency, such as aluminum or silver, or comprise a metal core plated with aluminum or silver.

Furthermore, the heat blocker 30 is installed at a location depending on the operational temperature of the process to be performed. The heat blocker 30 is preferably positioned between the wafer boat 27 and rotational shaft 26.

In the semiconductor manufacturing apparatus of the present invention, the elevating plate 25 is lowered until the wafer boat is moved out of the furnace chamber. Then the wafer boat 27 is filled with a plurality of wafers. Once the wafer boat 27 is loaded, the elevating plate 25 is raised to transfer the loaded wafer boat 27 into the furnace chamber.

Next, the rotational shaft 26 is driven to rotate the wafer boat 27 within the furnace chamber. At the same time, the heater 28 is operated to increase the internal temperature of the furnace.

Once the internal temperature of the furnace remains stable at an optimum level, the reactant gas is supplied into the reaction space through the gas supply tube 23 to facilitate a deposition process or the like. After the deposition process proceeds for a suitable period of time, the reactant gas is exhausted through the exhaust opening 24. Finally, the elevating plate 25 is lowered again so that the processed wafers can be unloaded.

At this time, the internal temperature of the furnace, particularly at the bottom part thereof, decreases as the wafer boat 27 is lowered and while a new wafer boat 27 is loaded. During this time, the decrease in the internal temperature of the heater is minimized by the heat blocker 30 positioned under the wafer boat 27.

That is, the plurality of heat-reflecting plates 33 reflect the heat leaking from the furnace chamber back into the furnace chamber so as to minimize a reduction in the internal temperature of the furnace. As described above, the semiconductor manufacturing furnace of the present invention has heat-reflecting plates which are fixed in place by support pins positioned to keep the heat-reflecting plates still during operation. Thus, the internal temperature of the furnace is kept stable between the time just after the wafer boat is loaded and the processing of the wafers begins. As a result, the total time required for processing the wafers is relatively short. Accordingly, the heat blocker leads to improved productivity and uniformity in the processed wafers.

What is claimed is:

1. A semiconductor manufacturing apparatus comprising:

a furnace chamber having an open bottom;

a heater operatively associated with said furnace chamber so as to heat the inside thereof;

a wafer boat;

an elevating plate on which said wafer boat is supported, said elevating plate being disposed under the open bottom of said furnace chamber, and said elevating plate being movable up and down vertically relative to said furnace chamber between positions at which said wafer boat is located inside the furnace chamber and beneath the furnace chamber, respectively; and a heater block interposed between said wafer boat and said elevating plate, said heater block comprising a sealed case atop which said wafer boat is mounted, at least one horizontally extending heat-reflecting plate disposed in said case, whereby the at least one heat-reflecting plate reflects heat upwardly into the furnace chamber as the elevating plate is lowered to thereby prevent thermal loss at the open bottom of the furnace chamber, and a plurality of pins fixing said at least one heat-reflecting plate in place so as to be immovable relative to said case and thereby preventing the at least one heat-reflecting plate form vibrating during operation of the apparatus.

2. The semiconductor manufacturing apparatus as claimed in claim 1, wherein said support pins include a plurality of external support pins located against the outer periphery of each said at least one heat-reflecting plate, and a plurality of internal support pins disposed against a major surface of the plate.

3. The semiconductor manufacturing apparatus as claimed in claim 1, wherein said case includes an outer casing and a diaphragm extending horizontally across the interior of the outer casing, and said at least one heat-reflecting plate comprises a heat-reflecting plate lying on said diaphragm.

4. The semiconductor manufacturing apparatus as claimed in claim 1, wherein the interior of said case is in a vacuum state.

* * * * *